(12) United States Patent
Satou

(10) Patent No.: US 10,305,391 B2
(45) Date of Patent: May 28, 2019

(54) INVERTER

(71) Applicant: DAIKIN INDUSTRIES, LTD., Osaka-Shi, Osaka (JP)

(72) Inventor: Toshiaki Satou, Osaka (JP)

(73) Assignee: DAIKIN INDUSTRIES, LTD., Osaka-Shi, Osaka (JP)

( * ) Notice: Subject to any disclaimer, the term of this patent is extended or adjusted under 35 U.S.C. 154(b) by 0 days.

(21) Appl. No.: 15/779,673

(22) PCT Filed: Dec. 7, 2016

(86) PCT No.: PCT/JP2016/086374
§ 371 (c)(1),
(2) Date: May 29, 2018

(87) PCT Pub. No.: WO2017/115627
PCT Pub. Date: Jul. 6, 2017

(65) Prior Publication Data
US 2018/0359846 A1 Dec. 13, 2018

(30) Foreign Application Priority Data
Dec. 28, 2015 (JP) ................. 2015-256553

(51) Int. Cl.
*H02M 7/48* (2007.01)
*H05K 7/20* (2006.01)
(52) U.S. Cl.
CPC .................... *H02M 7/48* (2013.01)
(58) Field of Classification Search
CPC ........ H05K 1/0201–0212; H05K 7/2089–209; H01G 2/08; H01G 9/0003
See application file for complete search history.

(56) References Cited

U.S. PATENT DOCUMENTS

| 5,016,139 A * | 5/1991 | Stopa .................. H05K 5/0247 307/150 |
| 6,212,071 B1 * | 4/2001 | Roessler .............. H05K 1/0209 174/252 |
| 6,212,086 B1 * | 4/2001 | Dinh ...................... H02M 3/00 363/144 |

(Continued)

FOREIGN PATENT DOCUMENTS

| CN | 201708703 U | 1/2011 |
| JP | 10-336985 A | 12/1998 |

(Continued)

OTHER PUBLICATIONS

International Search Report issued in PCT/JP2016/086374 (PCT/ISA/210), dated Jan. 24, 2017, 2 pages.

*Primary Examiner* — Robert J Hoffberg
(74) *Attorney, Agent, or Firm* — Birch, Stewart, Kolasch & Birch, LLP

(57) ABSTRACT

An inverter includes a printed circuit board, an electrolytic capacitor, and a power device. The electrolytic capacitor is horizontally disposed and mounted on one surface of the printed circuit board. The power device is mounted on the printed circuit board, and includes a terminal. A metal object includes a heat dissipating portion facing the electrolytic capacitor on the surface and dissipating heat generated by the power device. The metal object connects the terminal to the terminal.

5 Claims, 3 Drawing Sheets

(56) References Cited

U.S. PATENT DOCUMENTS

| | | | | |
|---|---|---|---|---|
| 6,257,329 B1 * | 7/2001 | Balzano | ............... | H05K 1/0204 |
| | | | | 165/185 |
| 6,930,885 B2 * | 8/2005 | Barcley | ............... | H01L 23/3677 |
| | | | | 174/252 |
| 7,054,159 B2 * | 5/2006 | Nakamura | .......... | H01L 23/3677 |
| | | | | 165/185 |
| 7,974,101 B2 * | 7/2011 | Azuma | .................... | B60K 6/48 |
| | | | | 361/760 |
| 9,642,289 B2 * | 5/2017 | Standing | ................ | H05K 7/209 |
| 2004/0061138 A1 | 4/2004 | Shinohara et al. | | |
| 2017/0196118 A1 * | 7/2017 | Standing | ................ | H05K 7/209 |
| 2018/0079377 A1 * | 3/2018 | Maeda | ................ | B60R 16/0238 |

FOREIGN PATENT DOCUMENTS

| | | | |
|---|---|---|---|
| JP | 2002-345262 | A | 11/2002 |
| JP | 2004-119667 | A | 4/2004 |
| JP | 2006-41068 | A | 2/2006 |
| JP | 2011-239485 | A | 11/2011 |

* cited by examiner

INVERTER

TECHNICAL FIELD

This invention relates to a technique for dissipating heat of a power device, and particularly to a technique for dissipating, on a printed circuit board, heat of a power device mounted together with an electrolytic capacitor on the printed circuit board.

BACKGROUND ART

Indoor units of air conditioners require miniaturization of electrical equipment to lengthen the effective length of the heat exchanger. Reduction in the thickness of the inverter included in the electrical equipment is effective at achieving the miniaturization of the electrical equipment. The inverter generally includes a power device used for power conversion, and a smoothing capacitor.

Since an electrolytic capacitor is normally used as the smoothing capacitor, a technique for disposing the smoothing capacitor horizontally (disposing the smoothing capacitor so that the longitudinal direction of the smoothing capacitor is approximately parallel to the substrate on which the smoothing capacitor is to be mounted) has been proposed to reduce the thickness of the inverter (see, for example, Japanese Patent Application Laid-Open No. 2006-041068 below). On the other hand, some power devices are integrated into, for example, inverter power modules, and a technique for dissipating heat of such inverter power modules has been proposed (see, for example, Japanese Patent Application Laid-Open No. 10-336985 on heat dissipation).

SUMMARY OF INVENTION

Problems to be Solved by the Invention

The capacitance of the smoothing capacitor is normally selected approximately from several tens to several hundreds μF. Thus, the electrolytic capacitor is used as the smoothing capacitor. Since the electrolytic capacitor having such degree of capacitance is not only high but also large in the width direction, the electrolytic capacitor disposed horizontally occupies a large region along the substrate on which the electrolytic capacitor is mounted. Moreover, the outer shell of the electrolytic capacitor is generally made of a metal covered with a film. Since the metal has the same potential as that of the negative side of the capacitor, the potential of the metal in an inverter is set to a ground potential (a potential of a lower-potential side of DC buses). Thus, disposing a component handling a generally-called heavy current near the electrolytic capacitor is not preferable from the viewpoint of securing an insulation distance. In other words, disposing the electrolytic capacitor horizontally, which solely contributes to reduction in the thickness, does not necessarily contribute to miniaturization of the electrical equipment.

A heat dissipation metal for dissipating heat of a power device also occupies the large region. Thus, a structure for dissipating, on a printed circuit board, heat of a power device mounted together with an electrolytic capacitor on the printed circuit board has a tendency to occupy the large region.

To this end, this invention provides a technique for dissipating heat of a power device mounted on a printed circuit board together with an electrolytic capacitor without occupying a large region on a surface along the printed circuit board.

The objects, features, aspects and advantages of this invention will become more apparent from the following detailed description and the accompanying drawings.

Means to Solve the Problems

An inverter according to this invention includes: a printed circuit board (9); an electrolytic capacitor (4) horizontally disposed and mounted on one surface (90a) of the printed circuit board; and a power device (1) mounted on the printed circuit board and including a terminal (11) connected to a terminal (41) of the electrolytic capacitor.

According to the first aspect, the printed circuit board includes: a plate-shaped substrate (90) with insulation properties; and a metal object (2) connecting the terminal of the electrolytic capacitor to the terminal of the power device, the metal object including a heat dissipating portion (22) facing the electrolytic capacitor on the one surface and dissipating heat generated by the power device.

The second aspect of the inverter of this invention is the first aspect thereof in which the metal object (2) further includes a wiring (21) connecting the terminal (11) of the power device to the terminal (41) of the electrolytic capacitor (4). The heat dissipating portion (22) is provided to branch off from the wiring, and is connected to the terminal (11) of the power device and the terminal of the electrolytic capacitor through the wiring at a place (20, 23) of the branching.

The third aspect of the inverter of this invention is the second aspect thereof in which the power device (1) is disposed on the one surface (90a), the metal object (2) is of an even thickness, and the heat dissipating portion (22) is wider than a pattern width required for the wiring (21).

The fourth aspect of the inverter of this invention is the third aspect thereof in which the heat dissipating portion (22) includes a portion exceeding a width defined by 1 mm/A at a maximum value of a current flowing through the wiring.

The fifth aspect of the inverter of this invention is the second aspect thereof in which the power device (1) is disposed on another surface (90b) of the printed circuit board, and the metal object further includes a through hole (23) penetrating the substrate (90) to connect the wiring (21) to the heat dissipating portion (22).

EFFECTS OF THE INVENTION

In the inverter according to this invention, heat of the power device mounted on the printed circuit board together with the electrolytic capacitor will be dissipated without occupying a large region on a surface along the printed circuit board.

DESCRIPTION OF EMBODIMENTS

First Embodiment

Figure 1:
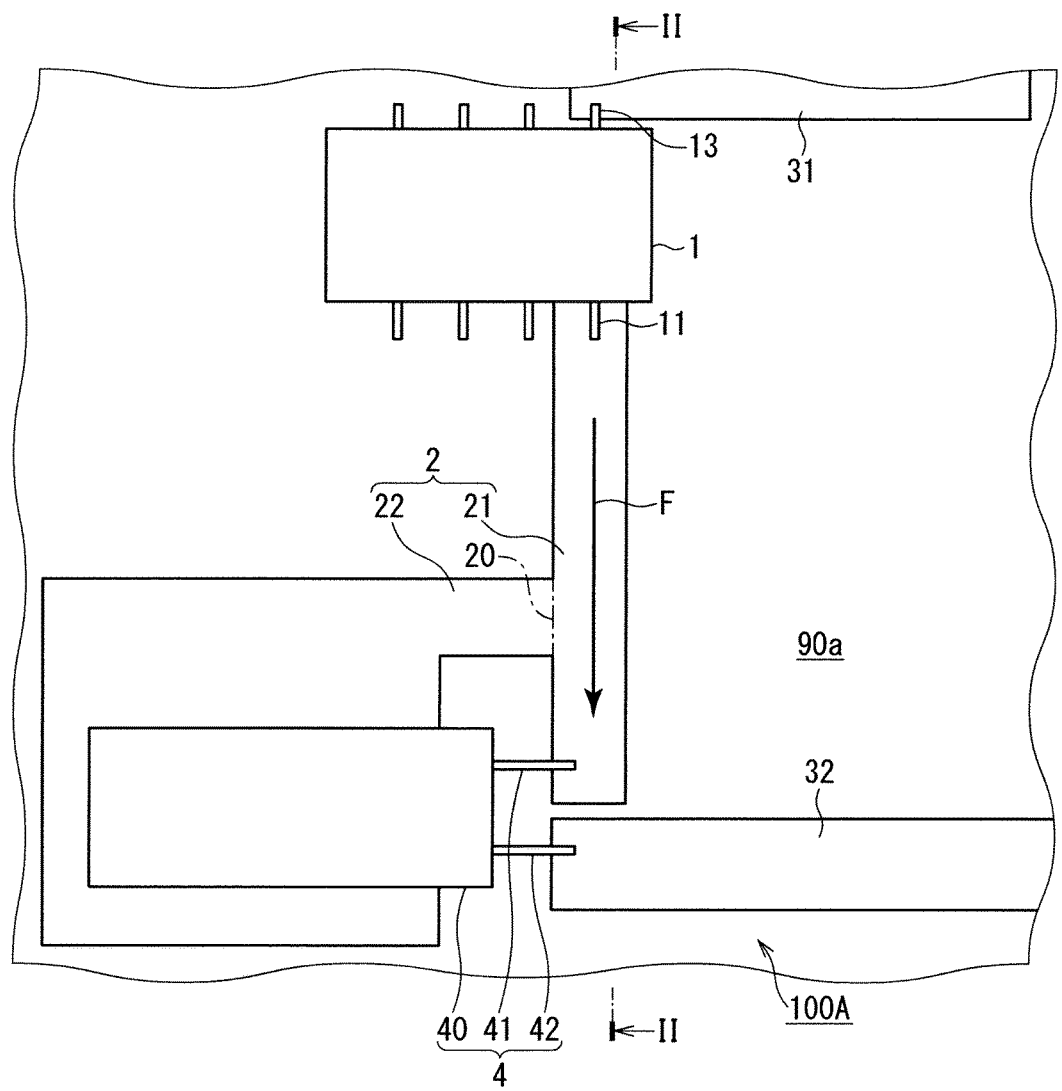
FIG. 1 is a plan view exemplifying a structure of an inverter according to the first embodiment.
Figure 2:
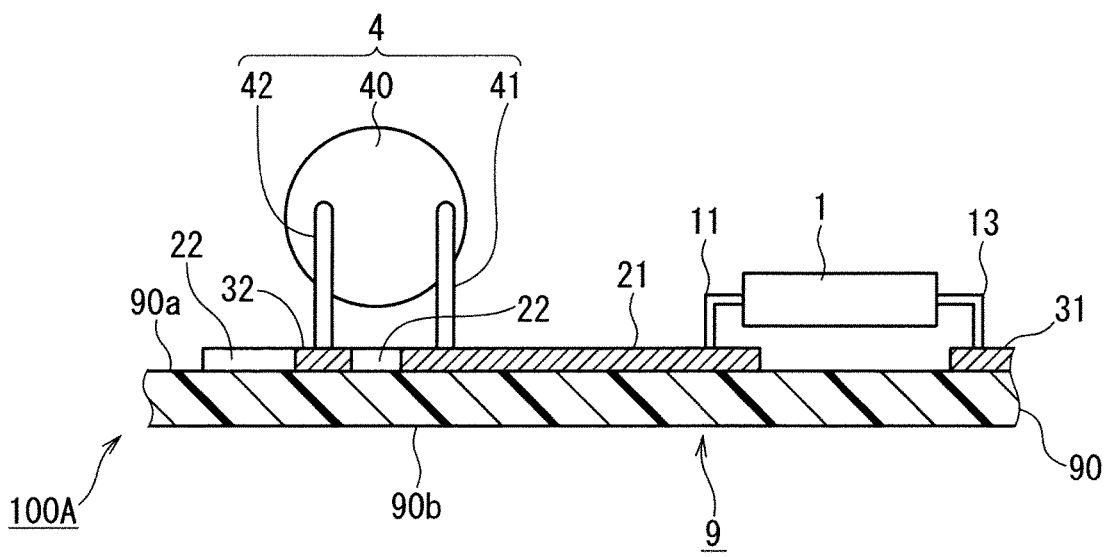
FIG. 2 is a cross-sectional view on arrows at positions II-II of FIG. 1.

FIG. 1 is a plan view exemplifying a structure of an inverter 100A according to the first embodiment. FIG. 2 is a cross-sectional view on arrows at positions II-II of FIG. 1.

The inverter 100A includes a power device 1, an electrolytic capacitor 4, and a printed circuit board 9. The power device 1 and the electrolytic capacitor 4 are mounted on the printed circuit board 9.

The electrolytic capacitor 4 is horizontally disposed and mounted on one surface 90a of the printed circuit board 9. The electrolytic capacitor 4 includes a main body 40 and terminals 41 and 42.

The power device 1 includes a plurality of terminals one of which is a terminal 11 connected to the terminal 41 of the electrolytic capacitor 4. According to the first embodiment, the power device 1 is also disposed on the surface 90a.

The printed circuit board 9 includes a substrate 90 and a metal object 2. The substrate 90 has insulation properties and is plate-shaped. The metal object 2 includes a heat dissipating portion 22. The heat dissipating portion 22 faces the electrolytic capacitor 4 on the surface 90a, and dissipates heat generated by the power device 1. Another surface 90b (a surface opposite to the surface 90a) of the printed circuit board 9 has nothing to do with the structure for obtaining the advantages in the first embodiment.

The metal object 2 further includes a wiring 21 according to the first embodiment. The wiring 21 connects the terminal 11 to the terminal 41. Specifically, one end of the wiring 21 is connected to the terminal 11, and the other end of the wiring 21 is connected to the terminal 41. The heat dissipating portion 22 is provided to branch off from the wiring 21 at a place 20. Thus, it can be said that the heat dissipating portion 22 is connected to both the terminals 11 and 41 through the wiring 21.

From the viewpoint of dissipating heat generated by the power device 1, the branching place 20 is preferably closer to the terminal 11 than a connection point between the wiring 21 and the terminal 41.

Wirings 31 and 32 are also provided on the surface 90a. The power device 1 includes, other than the terminal 11, a terminal 13 connected to the wiring 31. The terminal 42 is connected to the wiring 32. Although the power device 1 includes terminals other than the terminals 11 and 13, the connection relationship between such terminals and wirings (not illustrated) is irrelevant to the first embodiment. Thus, the description thereof will be omitted.

Figure 3:
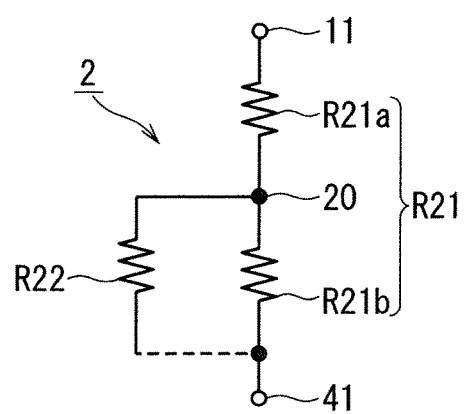
FIG. 3 illustrates an electric equivalent circuit of a metal object.

FIG. 3 illustrates an electric equivalent circuit of the metal object 2 illustrated in FIGS. 1 and 2. An electric resistance of the wiring 21 between the terminal 11 and the place 20 is depicted as an equivalent resistor R21a. An electric resistance of the wiring 21 between the place 20 and the terminal 41 is depicted as an equivalent resistor R21b. A total electric resistance of the wiring 21 is depicted as an equivalent resistor R21 by the series connection of the equivalent resistors R21a and R21b.

An arrow F in FIG. 1 schematically illustrates a current flowing from the terminal 11 to the terminal 41. Since the heat dissipating portion 22 branches off from the wiring 21 closer to the terminal 11 than the connection point between the wiring 21 and the terminal 41, the current is hardly diverted to the heat dissipating portion 22 but flows from the terminal 11 to the terminal 41.

An electric resistance of the heat dissipating portion 22 is depicted as an equivalent resistor R22. Since the heat dissipating portion 22 branches off from the wiring 21 at the place 20 as described above, the other end of the equivalent resistor R22 is not substantially connected to the terminal 41. Thus, FIG. 3 illustrates connection of one end of the equivalent resistor R22 to the equivalent resistors R21a and R21b at the place 20 using solid lines, and also connection of the other end of the equivalent resistor R22 to the terminal 41 using a broken line.

There may be a plurality of the places 20. The heat dissipating portion 22 may branch off from the wiring 21 at a plurality of portions. In other words, the heat dissipating portion 22 may be jointed to the wiring 21 at the portions. This is because the current is hardly diverted to the heat dissipating portion 22 also with such a structure.

Thus, the heat dissipating portion 22 does not function as a current path between the terminals 11 and 41. However, the heat dissipating portion 22 functions as dissipating heat of the power device 1 through the terminal 11 and the wiring 21. Since the heat dissipating portion 22 faces the main body 40 of the electrolytic capacitor 4, the region occupied by the heat dissipating portion 22 has an overlap with the region occupied by the main body 40 along the surface 90a.

Thus, the heat of the power device 1 mounted together with the electrolytic capacitor 4 on the printed circuit board 9 can be dissipated without occupying a large region on the surface 90a along the printed circuit board 9.

Since the heat dissipating portion 22 faces the main body 40 of the electrolytic capacitor 4, the heat dissipating portion 22 preferably has the same potential as that of the negative side of the electrolytic capacitor 4, i.e., the ground potential (the potential of the lower-potential side of DC buses). This is possible by using the wiring 21 as the lower-potential side of the buses of the inverter 100A. In other words, both the terminal 11 of the power device 1 and the terminal 41 of the electrolytic capacitor 4 are terminals on the lower-potential side of the DC buses of the inverter 100A. Since the terminal 42 should be connected to a high potential end of the DC buses of the inverter 100A in such a case, the wiring 32 is used as a bus on a higher-potential side of the DC buses of the inverter 100A. For example, both of the wirings 31 and 32 may be used as the bus on the higher-potential side so that the terminal 13 should be connected to a high potential end of the inverter 100A.

The metal object 2 is normally of an even thickness to avoid complexity in the manufacturing processes. Since the heat dissipating portion 22 as well as the wiring 21 is a component of the metal object 2, both the heat dissipating portion 22 and the wiring 21 are normally of even thickness.

For example, the pattern width of the wiring 21 is preferably set to a value defined by 1 mm/A at the maximum value of a current flowing through the wiring 21 (exemplified by the arrow F in FIG. 1). For example, the standard MIL-STD-257A defines allowable current values each corresponding to the thickness of a wiring (the thickness of copper foil) and temperature rise in the printed circuit board 9. Although the pattern width and the allowable value are not completely in a direct proportional relationship, it is understood that a temperature rise value falls within 10 degrees centigrade when 1 mm/A is used as a design value.

With the function of dissipating heat, the heat dissipating portion 22 is preferably provided widely on the surface 90a. Although the heat dissipating portion 22 does not function as a current path between the terminals 11 and 41, the heat dissipating portion 22 is preferably wider than the pattern width required for the wiring 21 as a current path. In other words, the heat dissipating portion 22 preferably includes a portion exceeding the pattern width defined by 1 mm/A.

Normally, a wiring pattern is not set to be wider than that for the assumed current density from the viewpoint of reducing materials. In other words, the pattern width of the heat dissipating portion 22 is preferably set wider from the viewpoint of dissipating heat.

Second Embodiment

Figure 4:
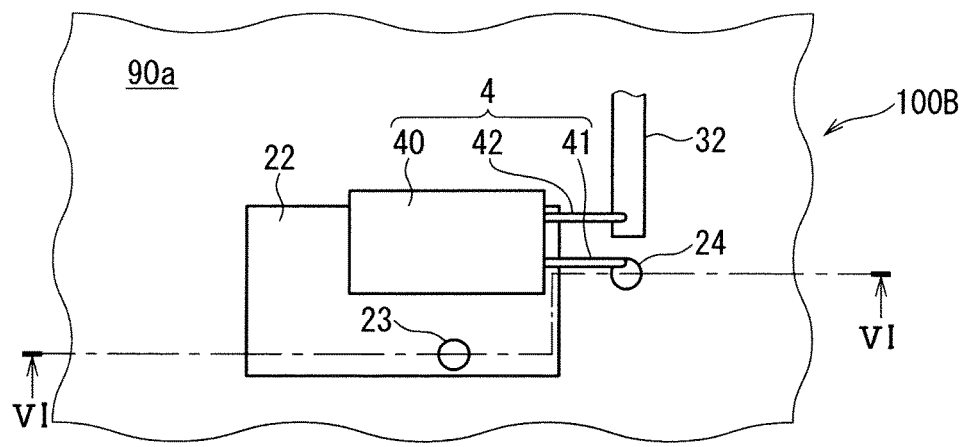
FIG. 4 is a top view exemplifying a structure of an inverter according to the second embodiment.
Figure 5:
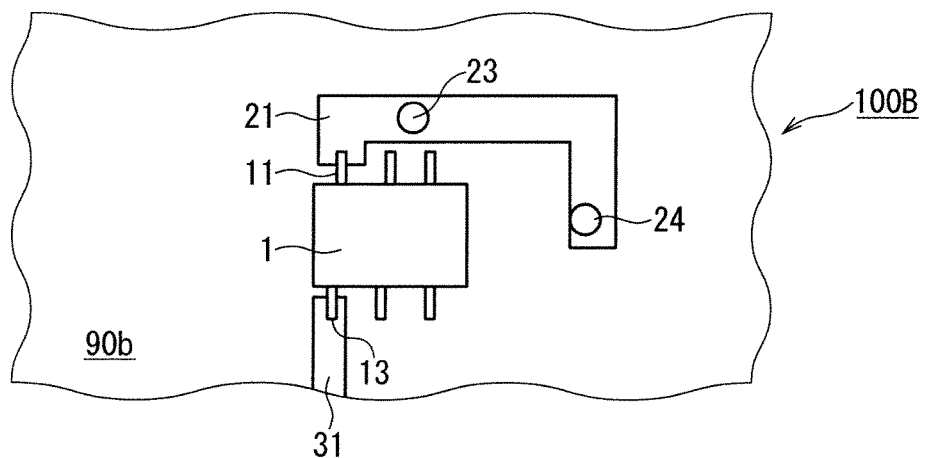
FIG. 5 is a bottom view exemplifying the structure of the inverter according to the second embodiment.
Figure 6:
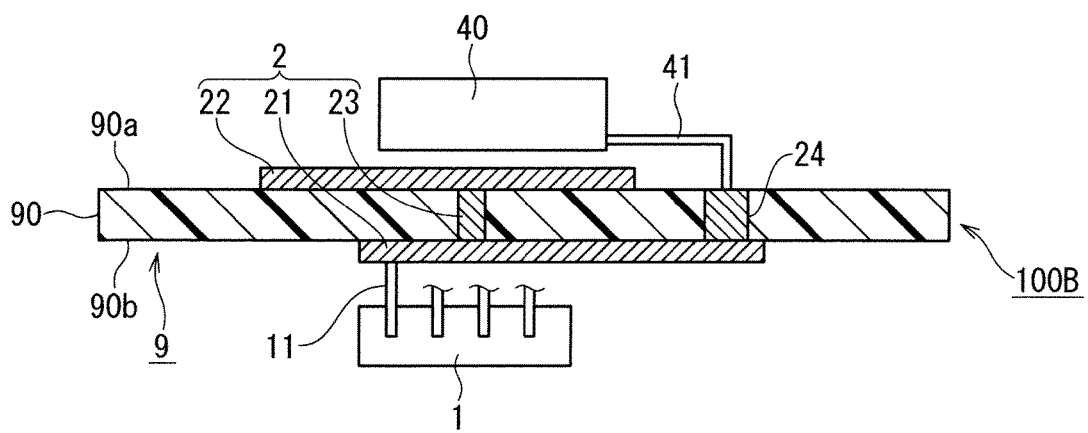
FIG. 6 is a cross-sectional view on arrows at positions VI-VI of FIG. 4.

FIGS. 4 and 5 illustrate a top view and a bottom view, respectively, for exemplifying a structure of an inverter 100B according to the second embodiment. FIG. 6 is a cross-sectional view on arrows at positions VI-VI of FIG. 4.

The inverter 100B includes the power device 1, the electrolytic capacitor 4, and the printed circuit board 9. The power device 1 and the electrolytic capacitor 4 are mounted on the printed circuit board 9.

The electrolytic capacitor 4 is horizontally disposed and mounted on the one surface 90a of the printed circuit board 9. The electrolytic capacitor 4 includes the main body 40 and the terminals 41 and 42.

The power device 1 includes a plurality of terminals one of which is the terminal 11 connected to the terminal 41 of the electrolytic capacitor 4. According to the second embodiment, the power device 1 is disposed on a surface 90b.

FIG. 4 has been used as a plan view seen from the surface 90a side as the top view, whereas FIG. 5 has been used as a plan view seen from the surface 90b side as the bottom view.

The printed circuit board 9 includes the substrate 90 and the metal object 2. The substrate 90 has insulation properties and is plate-shaped. The metal object 2 includes the wiring 21, the heat dissipating portion 22, and through holes 23 and 24.

The heat dissipating portion 22 faces the electrolytic capacitor 4 on the surface 90a, and dissipates heat generated by the power device 1.

The wiring 21 is provided on the surface 90b, and is connected to the terminal 11. The through hole 24 penetrates the substrate 90 to connect the wiring 21 to the terminal 41. Thus, the wiring 21 connects the terminal 11 to the terminal 41 through the through hole 24.

The heat dissipating portion 22 is provided on the surface 90a to face the electrolytic capacitor 4, and dissipates heat generated by the power device 1. Specifically, the heat dissipating portion 22 is connected to the wiring 21 through the through hole 23 that penetrates the substrate 90.

Thus, it is possible to provide the heat dissipating portion 22 that branches off at the through hole 23 between an end of the wiring 21 to be connected to the terminal 11 and an end of the wiring 21 to be connected to the terminal 41 through the through hole 24.

Thus, the heat dissipating portion 22 does not function as a current path between the terminals 11 and 41 but functions as dissipating heat of the power device 1 through the terminal 11, the wiring 21, and the through hole 23 according to the second embodiment similarly as the first embodiment. Since the heat dissipating portion 22 faces the main body 40 of the electrolytic capacitor 4, the region occupied by the heat dissipating portion 22 has an overlap with the region occupied by the main body 40 along the surface 90a.

Thus, the heat of the power device 1 mounted together with the electrolytic capacitor 4 on the printed circuit board 9 can be dissipated without occupying a large region on the surface 90a along the printed circuit board 9, similarly as the first embodiment.

The wiring 31 is provided on the surface 90b, and the wiring 32 is provided on the surface 90a. The power device 1 includes, other than the terminal 11, the terminal 13 connected to the wiring 31. The terminal 42 is connected to the wiring 32. Here, the wirings 31 and 32 are connected through a through hole (not illustrated). Although the power device 1 includes terminals other than the terminals 11 and 13, the connection relationship between such terminals and wirings (not illustrated) is irrelevant to the second embodiment. Thus, the description thereof will be omitted.

While this invention has been described in detail, the foregoing description is in all aspects illustrative and does not restrict the invention. It is therefore understood that numerous modifications and variations that have not been exemplified can be devised without departing from the scope of the invention.

The invention claimed is:

1. An inverter comprising:
a printed circuit board;
an electrolytic capacitor mounted on one surface of the printed circuit board, a longitudinal direction of the electrolytic capacitor disposed substantially parallel to the one surface of the printed circuit board; and
a power device mounted on the printed circuit board and including a terminal connected to a terminal of the electrolytic capacitor,
the printed circuit board including:
a plate-shaped substrate with insulation properties; and
a metal object connecting the terminal of the electrolytic capacitor to the terminal of the power device, the metal object including a heat dissipating portion facing the electrolytic capacitor on the one surface and dissipating heat generated by the power device.

2. The inverter according to claim 1,
wherein the metal object further includes a wiring connecting the terminal of the power device to the terminal of the electrolytic capacitor, and
the heat dissipating portion is provided to branch off from the wiring, and is connected to the terminal of the power device and the terminal of the electrolytic capacitor through the wiring at a place of the branching.

3. The inverter according to claim 2,
wherein the power device is disposed on the one surface,
the metal object is of an even thickness, and
the heat dissipating portion is wider than a pattern width required for the wiring.

4. The inverter according to claim 3,
wherein the heat dissipating portion includes a portion exceeding a width defined by 1 mm/A at a maximum value of a current flowing through the wiring.

5. The inverter according to claim 2,
wherein the power device is disposed on another surface of the printed circuit board, the another surface opposite to the one surface of the printed circuit board, and
the metal object further includes a through hole penetrating the substrate to connect the wiring to the heat dissipating portion.

* * * * *